United States Patent
Choi et al.

(10) Patent No.: US 9,337,848 B2
(45) Date of Patent: May 10, 2016

(54) CLOCK AND DATA RECOVERY DEVICE

(71) Applicant: Industry-Academic Cooperation Foundation, Yonsei University, Seoul (KR)

(72) Inventors: Woo-Young Choi, Seoul (KR); Dae-hyun Kwon, Seoul (KR); Young-Seok Park, Gyeonggi-do (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 14/634,392

(22) Filed: Feb. 27, 2015

(65) Prior Publication Data

US 2015/0244514 A1  Aug. 27, 2015

(30) Foreign Application Priority Data

Feb. 27, 2014 (KR) .................. 10-2014-0023688
May 22, 2014 (KR) .................. 10-2014-0061735

(51) Int. Cl.
*H04L 25/40* (2006.01)
*H03L 7/081* (2006.01)
(Continued)

(52) U.S. Cl.
CPC ........ *H03L 7/081* (2013.01); *H04L 1/20* (2013.01); *H04L 7/033* (2013.01)

(58) Field of Classification Search
CPC ..... H04L 7/033; H04L 7/0377; H04L 7/0814; H04L 7/0891; H03C 3/095; H03C 3/0925
USPC .......... 375/371, 373, 375, 376; 327/156, 157; 455/103, 127
See application file for complete search history.

(56) References Cited

U.S. PATENT DOCUMENTS 7,512,205 B1 * 3/2009 Erol ............... H03C 3/0925
375/375
7,999,583 B2   8/2011 Rhee et al.
(Continued)

FOREIGN PATENT DOCUMENTS

GB     2349520      1/2000
JP     2001127623   5/2001
(Continued)

OTHER PUBLICATIONS

Extended European Search Report for EP App No. 15157022.3 dated Jul. 2, 2015, 6 pgs.
(Continued)

*Primary Examiner* — Khai Tran
(74) *Attorney, Agent, or Firm* — Procopio, Cory, Hargreaves & Savitch LLP

(57) ABSTRACT

A clock and data recovery device is provided which includes a phase detector, a charge pump unit, a loop filter unit, and a voltage controlled oscillator. The phase detector detects a phase of a data clock signal to output a comparison signal. The charge pump unit adjusts the amount of charges to be supplied according to the comparison signal. The loop filter unit accumulates the amount of charges to be supplied to output an adjustment signal. The voltage controlled oscillator generates an output clock signal variable according to the adjustment signal. The phase detector compares phases of the data clock signal and each of modulated clock signals sequentially received to output the comparison signal. The modulated clock signals are signals modulated from the output clock signal to have different phases.

18 Claims, 20 Drawing Sheets

(51) Int. Cl.
*H04L 1/20* (2006.01)
*H04L 7/033* (2006.01)

(56) References Cited

U.S. PATENT DOCUMENTS

| | | | |
|---|---|---|---|
| 8,718,217 B2 | 5/2014 | Walker et al. | |
| 2005/0041755 A1* | 2/2005 | Hammes | H03C 3/0925 375/295 |
| 2007/0206711 A1 | 9/2007 | Aziz et al. | |
| 2009/0212835 A1 | 8/2009 | Xu et al. | |
| 2012/0126867 A1 | 5/2012 | Bae et al. | |
| 2012/0287967 A1* | 11/2012 | Ogasawara | H03L 7/197 375/146 |
| 2013/0108001 A1 | 5/2013 | Chang et al. | |
| 2013/0127505 A1* | 5/2013 | Kanda | H03C 3/095 327/157 |

FOREIGN PATENT DOCUMENTS

| | | |
|---|---|---|
| KR | 1020070077741 | 7/2007 |
| KR | 10-2008-0038777 A | 5/2008 |
| KR | 1020090115864 | 11/2009 |
| KR | 1020110078790 | 7/2011 |
| KR | 10-2012-0075781 A | 7/2012 |
| KR | 1020130077732 | 7/2013 |

OTHER PUBLICATIONS

Analui, B, et al., A 10-Gb/s Two-Dimensional Eye-Opening Monitor in 0.13-um Standard CMOS, IEEE Journal of Solid-State Circuits, 40(12), Dec. 2005, pp. 2689-2699.

Lee, B-J, et al., A 2.5-10-Gb/s CMOS Transceiver With Alternating Edge-Sampling Phase Detection for Loop Characteristic Stabilization, IEEE Journal of Solid-State Circuits, 38(11), Nov. 2003, pp. 1821-1829.

Lee, Y-L, et al., A 5Gb/s 1/4-Rate Clock and Data Recovery Circuit Using Dynamic Stepwise Bang-bang Phase Detector, IEEE Asian Solid-State Circuits Conference, Nov. 12-14, 2012, Kobe Japan, pp. 141-144.

Park, Y-S, A Clock and Data Recovery Circuit with a Novel-Multi-Level Bang-Bang Phase Detector Structure, dissertation, Yonsei University, 138 pgs. (published Mar. 27, 2014).

Ramezani, M., et al., An Improved Bang-bang Detector for Clock and Data Recovery Applications, University of Toronto, 2001 IEEE International Symposium, vol. 1, 2001, pp. I-715-I-718.

Sasaki, M., et al., A Circuit for On-Chip Skew Adjustment with Jitter and Setup Time Management, IEEE Asian Solid-State Circuits Conference, Nov. 8-10, 2010, Beijing China, pp. 4 pgs.

Notice of Grounds for Rejection for KR App No. 10-2014-0023688 dated Aug. 6, 2015, 14 pgs.

* cited by examiner

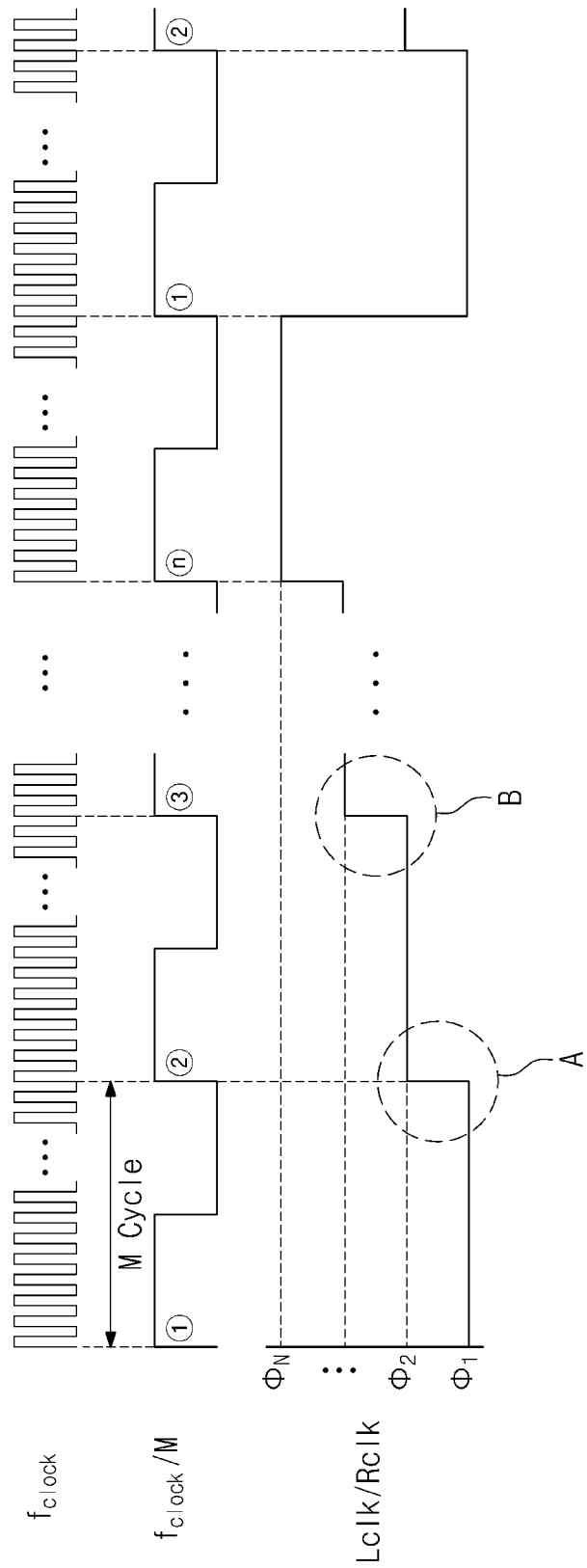

CLOCK AND DATA RECOVERY DEVICE

CROSS-REFERENCE TO RELATED APPLICATIONS

A claim for priority under 35 U.S.C. §119 is made to Korean Patent Application No. 10-2014-0023688 filed Feb. 27, 2014, and Korean Patent Application No. 10-2014-0061735 filed May 22, 2014, in the Korean Intellectual Property Office, the entire contents of which are hereby incorporated by reference.

BACKGROUND

Embodiments of the inventive concepts described herein relate to a clock and data recovery device.

A clock and data recovery circuit is a device that restores a clock fit to a data rate from noisy data and samples data to restore it to refined data. The clock and data recovery circuit is an indispensable circuit in most data receivers. FIG. 1 is a block diagram schematically illustrating a conventional clock and data recovery device. In general, a clock and data recovery device consists of a phase detector 11, a charge pump unit 12, a loop filter unit 13, and a voltage controlled oscillator 14. Among phase detectors, a linear phase detector determines whether either of data clock and an output clock of the voltage controlled oscillator precedes and how fast either of the data clock and the output clock is, whereas it has a disadvantage in that it is difficult to operate at high speed. Among the phase detectors, a bang-bang phase detector can operate at high speed, but it only determines whether either of data clock and a output clock of the voltage controlled oscillator precedes. That is, the bang-bang phase detector can not determine how fast either of the data clock and the output clock is. A multi-level characteristic can be implemented using the bang-bang phase detector. However, as a number of level increases, a circuit area and power consumption increase.

On the other hand, production cost of a semiconductor circuit gradually decreases, but a cost needed to test the semiconductor circuit does not decrease. For example, a special comparator that operates at high speed and has high resolution is required to measure jitter of the semiconductor circuit. This causes an increase in a hardware cost and acts as a limitation in designing hardware. Also, a conventional jitter measurement device additionally necessitates a reference clock. For this reason, the conventional jitter measurement device is unsuitable in working together with a clock and data recovery device.

SUMMARY

Embodiments of the inventive concepts provide a clock and data recovery device and a phase detector having small-size and low-power consumption characteristics and capable of detecting a phase in a multi-level.

Embodiments of the inventive concepts provide a clock and data recovery device capable of measuring its jitter characteristic simply and efficiently.

One aspect of embodiments of the inventive concept is directed to provide a clock and data recovery device which includes a phase detector, a charge pump unit, a loop filter unit, and a voltage controlled oscillator. The phase detector may detect a phase of a data clock signal to output a comparison signal. The charge pump unit may adjust the amount of charges to be supplied according to the comparison signal. The loop filter unit may accumulate the amount of charges to be supplied to output an adjustment signal. The voltage controlled oscillator may generate an output clock signal variable according to the adjustment signal. The phase detector may compare phases of the data clock signal and each of modulated clock signals sequentially received to output the comparison signal. The modulated clock signals may be signals modulated from the output clock signal to have different phases.

The clock and data recovery device may further include a modulation clock generation unit configured to generate the modulated clock signals from the output clock signal and provide the modulated clock signals sequentially to the phase detector.

The modulation clock generation unit may include a frequency divider configured to divide a frequency of the output clock signal to generate a frequency division clock signal; a bit generator configured to generate a bit signal in response to a clock edge of the frequency division clock signal; and a modulation clock output unit configured to sequentially output the modulated clock signals according to the bit signal.

The modulation clock generation unit may generate the modulated clock signals having a linear phase difference from the output clock signal.

The modulation clock generation unit may provide the phase detector with each modulated clock signal during a predetermined time period, the predetermined time period about each modulated clock signal may be set according to the repetition rate of the modulated clock signal, the number of modulated clock signals, or both.

The phase detector may include a first phase comparison unit configured to sequentially compare a phase of the data clock signal and a phase of each modulated clock signal to output a first comparison signal.

The phase detector further may include a second phase comparison unit configured to compare a phase of the data clock signal and a phase of the output clock signal to output a second comparison signal, and the charge pump unit may include a first charge pump configured to adjust the amount of charges to be supplied according to the first comparison signal; and a second charge pump configured to adjust the amount of charges to be supplied according to the second comparison signal.

The second phase comparison unit may include a first flip-flop configured to output the data clock signal in response to a first clock edge of the output clock signal; a second flip-flop configured to output an output value of the first flip-flop in response to the first clock edge; a third flip-flop configured to output the data clock signal in response to a second clock edge of the output clock signal; a fourth flip-flop configured to output an output value of the third flip-flop in response to the first clock edge; a first XOR gate configured to compare the output value of the first flip-flop and an output value of the fourth flip-flop; and a second XOR gate configured to compare an output value of the second flip-flop and the output value of the fourth flip-flop.

The first phase comparison unit may include a fifth flip-flop configured to output the data clock signal in response to a first modulated clock signal sequentially input; a sixth flip-flop configured to output an output value of the fifth flip-flop in response to the first clock edge; a seventh flip-flop configured to output the data clock signal in response to a second modulated clock signal sequentially input; an eighth flip-flop configured to output an output value of the seventh flip-flop in response to the first clock edge; a third XOR gate configured to compare the output value of the first or fourth flip-flop and an output value of the sixth flip-flop; and a fourth XOR gate configured to compare the output value of the second or fourth flip-flop and an output value of the eighth flip-flop.

The first modulated clock signal may be a signal having a phase leading the output clock signal, and the second modulated clock signal may be a signal having a phase lagging the output clock signal.

The first comparison signal may include an output value of the first XOR gate and an output value of the second XOR gate, and the second comparison signal may include an output value of the third XOR gate and an output value of the fourth XOR gate.

The clock and data recovery device may further include a jitter measurement unit configured to compare cumulative values of the comparison signal to measure a jitter, each cumulative value corresponding to each of the modulated clock signals.

The jitter measurement unit may include a plurality of counters configured to measure cumulative values of the comparison signals, the cumulative value being measured for each of the modulated clock signals.

The jitter measurement unit may further include a selection circuit connected between the phase detector and the plurality of counters, the selection circuit being configured to select one of the plurality of counters in response to a modulated clock signal and connect the selected at least one counter to the phase detector.

The jitter measurement unit may further include a histogram analysis unit configured to analyze cumulative values measured by the plurality of counters in a histogram method to measure a jitter.

Another aspect of embodiments of the inventive concept is directed to provide a phase-locked loop circuit including the clock and data recovery device.

Still another aspect of embodiments of the inventive concept is directed to provide a phase detector which includes a first phase comparison unit configured to sequentially receive modulated clock signals, modulated from a first clock signal to have different phases, and to compare phases of a data clock signal and each of the modulated clock signal sequentially input to output a first comparison signal.

The first phase comparison unit may sequentially receive the modulated clock signals modulated to have a linear phase difference from the first clock signal.

The first phase comparison unit may receive each of the modulated clock signals during the same time period and outputs the first comparison signal.

The phase-locked loop circuit may further include a second phase comparison unit configured to compare phases of the data clock signal and the first clock signal to output a second comparison signal.

According to an exemplary embodiment of the inventive concept, there are provided a clock and data recovery device and a phase detector having a small-size and low-power consumption characteristics and capable of detecting a phase in a multi-level.

Also, according to an exemplary embodiment of the inventive concept, it is possible to measure a jitter characteristic of a clock and data recovery device simply and efficiently.

BRIEF DESCRIPTION OF THE FIGURES

The above and other objects and features will become apparent from the following description with reference to the following figures, wherein like reference numerals refer to like parts throughout the various figures unless otherwise specified.

FIG. 5A is a timing diagram for describing a function of a modulation clock generation unit of a clock and data recovery device according to an exemplary embodiment of the inventive concept.

DETAILED DESCRIPTION

Figure 1:
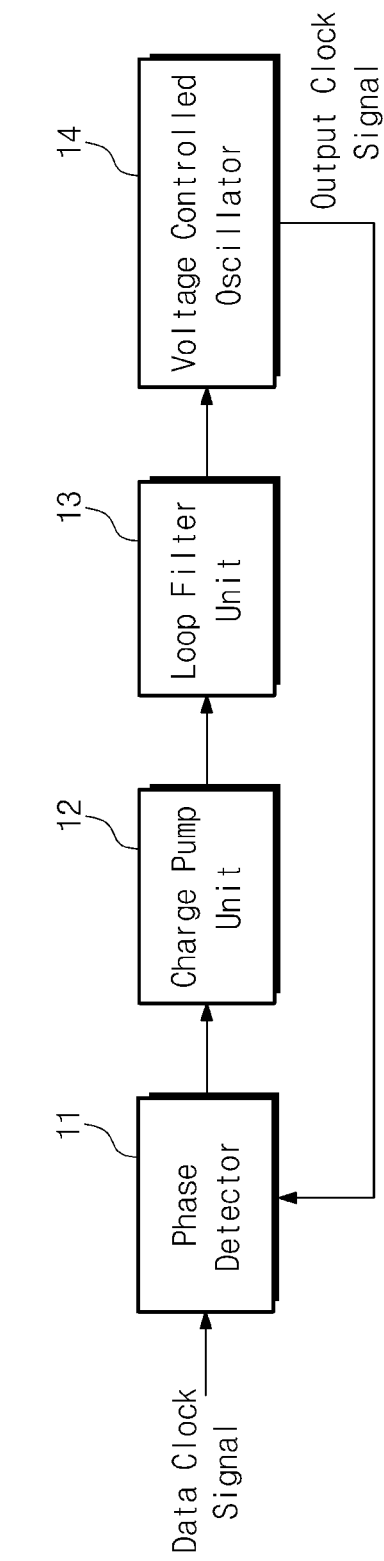
FIG. 1 is a block diagram schematically illustrating a conventional clock and data recovery device.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A clock and data restoration device according to an exemplary embodiment of the inventive concept may contain a phase detector which detects a phase of a data clock signal to output a comparison signal; a charge pump unit which adjusts the amount of charges to be supplied according to the comparison signal; a loop filter unit which accumulates the amount of charges to be supplied to output an adjustment signal; a voltage controlled oscillator which generates a variable output clock signal according to the adjustment signal; and a modulation clock generation unit which generates modulated clock signals using an output clock signal to provide them to the phase detector. The phase detector sequentially receives the modulated clock signals that the modulation clock generation unit generates by modulating a phase of the output clock signal so as to have different phases. The phase detector compares phases of the sequentially input modulated clock signal and a data clock signal to output the comparison signal. According to an exemplary embodiment of the inventive concept, an area and power consumption of the phase detector are minimized, thereby making it possible to implement a phase detector having a multi-level phase detection characteristic.

Figure 2:
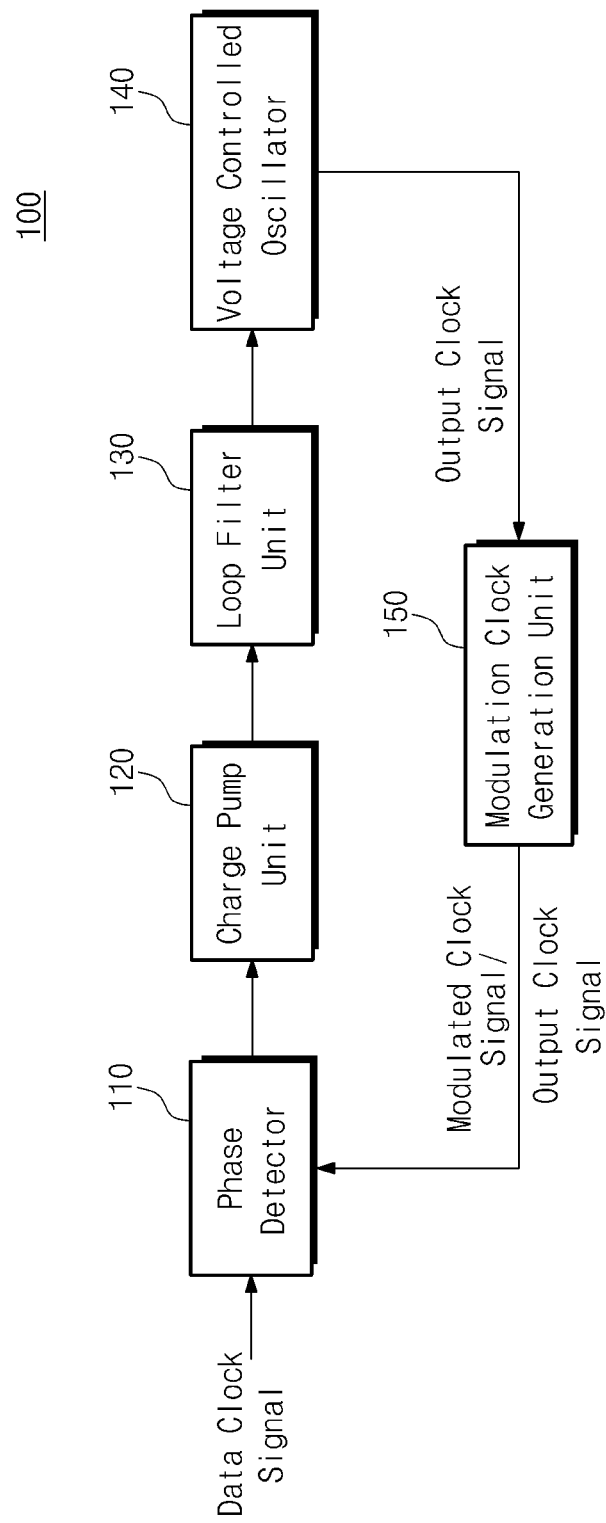
FIG. 2 is a block diagram schematically illustrating a clock and data recovery device according to an exemplary embodiment of the inventive concept.

FIG. 2 is a block diagram schematically illustrating a clock and data restoration device according to an exemplary embodiment of the inventive concept. A clock and data restoration device 100 may be implemented at a data receiver stage. The clock and data restoration device 100 receives a data clock signal from a data transmitter stage, restores a clock fit to a data rate of the data receiver stage from the data clock signal including noise, and restores noise-free and refined data through a sampling operation using the restored clock.

Referring to FIG. 2, the clock and data restoration device 100 according to an exemplary embodiment of the inventive concept contains a phase detector 110, a charge pump unit 120, a loop filter unit 130, a voltage controlled oscillator 140, and a modulation clock generation unit 150. The phase detector 110 receives the data clock signal and compares a phase of a data clock signal with a phase of a signal from the modulation clock generation unit 150 using an output clock signal from the voltage controlled oscillator 140 and modulated clock signals obtained by phase-modulating the output clock signal and outputs a comparison signal as a comparison result. The phase detector 110 sequentially receives the modulated clock signals that are modulated to have different phases using the output clock signal of the voltage controlled oscillator 140. The phase detector 110 compares phases of each of the modulated clock signals received sequentially and the data clock signal. A detailed structure, a detailed function, and an operation of the phase detector 110 will be described later.

The charge pump unit 120 adjusts the amount of charges to be supplied according to the comparison signal from the phase detector 110. The loop filter 130 accumulates the amount of charges adjusted by the charge pump unit 120 and outputs an adjustment signal. The voltage controlled oscillator 140 generates an output clock signal variable according to the adjustment signal from the loop filter unit 130. The modulation clock generation unit 150 modulates a phase of the output clock signal from the voltage controlled oscillator 140 to generate the modulated clock signals. The modulation clock generation unit 150 generates the modulated clock signals using the output clock signal so as to have different phases. The modulation clock generation unit 150 provides the phase detector 110 with the output clock signal and the modulated clock signals. The modulation clock generation unit 150 sequentially provides the modulated clock signals to the phase detector 110 by lapse of time.

Figure 3:
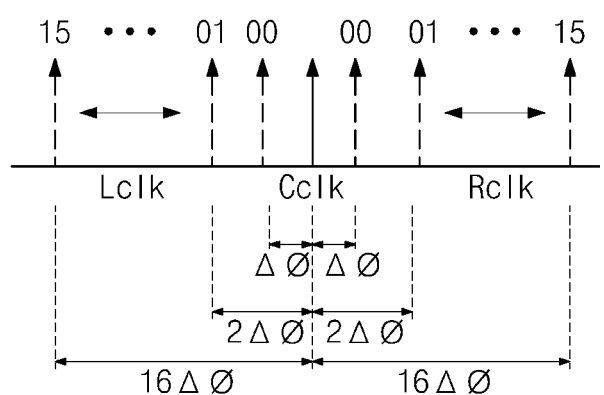
FIG. 3 is a diagram schematically illustrating modulated clock signals generated by a modulation clock generation unit of a clock and data recovery device according to an exemplary embodiment of the inventive concept.

FIG. 3 is a diagram schematically illustrating modulated clock signals generated from a modulation clock generation unit of a clock and data recovery device according to an exemplary embodiment of the inventive concept. Referring to FIGS. 2 and 3, a modulation clock generation unit 150 generates modulated clock signals, including a first modulated clock signal(s) Lclk and a second modulated clock signal(s) Rclk, using an output clock signal from a voltage controlled oscillator 140. In FIG. 3, an embodiment of the inventive concept is exemplified as there are generated a total of 32 modulated clock signals including first sixteen modulated clock signals Lclk and second sixteen modulated clock signals Rclk. However, the scope and spirit of the inventive concept may not be limited thereto.

The modulation clock generation unit 150 generates the first modulated clock signals Lclk, which are modulated from an output clock signal of a voltage controlled oscillator 140 to have a phase preceding a predetermined reference phase Cclk, based on the output clock signal and generates the second modulated clock signals Rclk, which are modulated from the output clock signal to have a phase lagging the reference phase Cclk, based on the output clock signal. The reference phase Cclk may be a 180° phase of the output clock signal of the voltage controlled oscillator 140. Alternatively, the reference phase Cclk may be set to have any other phase value of 0°.

To make phase detecting better, the modulated clock signals may be modulated to have a linear phase difference from the reference phase Cclk of the output clock signal. As illustrated in FIG. 3, the modulation clock generation unit 150 modulates a phase of the output clock signal from the voltage controlled oscillator 140 to have a constant phase difference $\Delta\Phi$ between adjacent modulated clock signals.

The modulation clock generation unit 150 outputs a pair of corresponding modulated clock signals among the first modulated clock signals Lclk and the second modulated clock signals Rclk to a phase detector 110 during a predetermined time period. In FIG. 3, the pair of corresponding modulated clock signals of the modulated clock signals may be marked by the same two-digit number "00", "01" . . . "15". The modulation clock generation unit 150 may sequentially output the modulated clock signals from "00" to "15" or vice versa. The modulation clock generation unit 150 provides the phase detector 110 with each pair of modulated clock signals during the same time period.

Figure 4A:
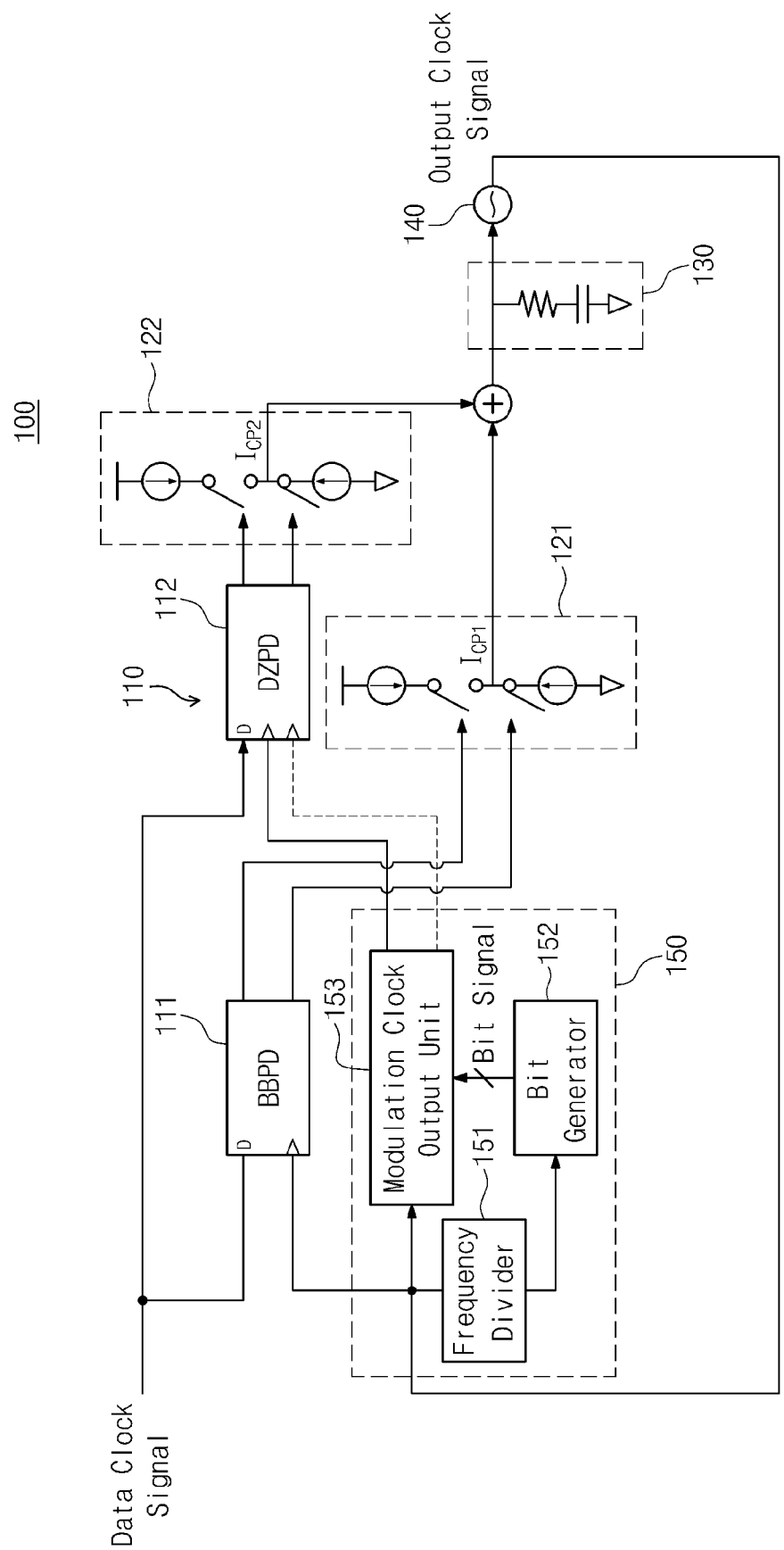
FIG. 4A is a detailed block diagram illustrating a clock and data recovery device according to an exemplary embodiment of the inventive concept.

FIG. 4A is a detailed block diagram illustrating a clock and data recovery device according to an exemplary embodiment of the inventive concept. Referring to FIG. 4A, a phase detector 110 contains a first phase comparison unit 112 and a second phase comparison unit 111. A charge pump unit 120 contains a first charge pump 122 and a second charge pump 121.

The first phase comparison unit 112 sequentially receives modulated clock signals from a modulation clock generation unit 150 and compares a phase of a data clock signal with a phase of each modulated clock signal every rising edge of the output clock signal using the modulated clock signal as a sampling signal. The first phase comparison unit 112 outputs a first comparison signal as a comparison result. The first phase comparison unit 112 determines a phase difference between the output clock signal from the voltage controlled oscillator 140 and the data clock signal as being one of multiple levels (or multi-level). The number of multiple levels may correspond to the number of paired modulated clock signals that the modulation clock generation unit 150 generates to have different phases.

The second phase comparison unit 111 compares phases of the data clock signal and the output clock signal of the voltage controlled oscillator 140 to output a second comparison signal. The second phase comparison unit 111 receives the output clock signal of the voltage controlled oscillator 140 as a sampling signal. The second phase comparison unit 111 compares phases of the data clock signal and the output clock signal every rising edge of the output clock signal of the voltage controlled oscillator 140. The second phase comparison unit 111 outputs a second comparison signal as a result of determining whether a phase of the output clock signal precedes a phase of the data clock signal. For example, the second phase comparison unit 111 may be implemented with a Bang-Bang Phase Detector (BBPD).

The second charge pump 121 adjusts the amount of charges to be supplied in response to the second comparison signal from the second phase comparison unit 111. The second phase comparison unit 111 implemented with the bang-bang phase detector determines whether a phase of the output clock signal is leading or lagging the data clock signal, but it does not determine how a phase of the output clock signal is leading or lagging the data clock signal. The clock and data recovery device 100 according to an exemplary embodiment of the inventive concept includes the first phase comparison unit 112 to determine a phase difference between the output clock signal and the data clock signal.

Figure 4B:
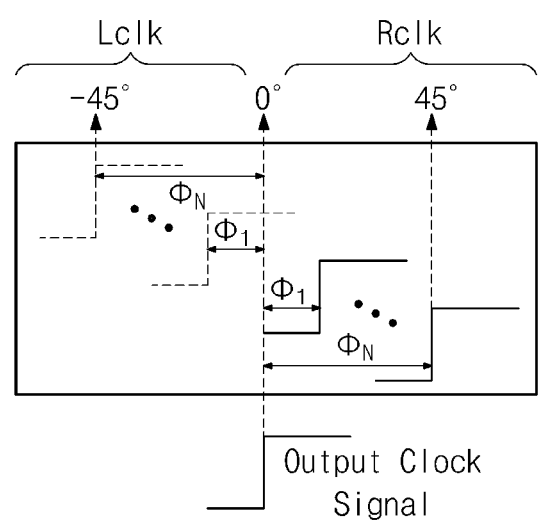
FIG. 4B is a diagram illustrating modulated clock signals input to a first phase comparison unit of a clock and data recovery device according to an exemplary embodiment of the inventive concept.

FIG. 4B is a diagram illustrating a modulated clock signal input to a first phase comparison unit of a clock and data recovery device according to an exemplary embodiment of the inventive concept. In FIG. 4B, signals designated by a dotted line correspond to first modulation clocks signal Lclk shown in FIG. 3, and signals designated by a solid line correspond to second modulated clock signals Rclk. In illustration of FIG. 4, a reference phase of an output clock signal of a voltage controlled oscillator 140 may be set to "0°". As illustrated, in the event that first N modulated clock signals Lclk and second N modulated clock signals Rclk are sequentially provided to a first phase comparison unit 112, a phase difference between the data clock signal and the output clock signal may be detected as one of N phase differences. Accordingly, as a phase interval between modulated clock signals becomes narrower and as the number of modulated clock signals increases, a phase difference between the data clock signal and the output clock signal is determined more precisely.

Returning to FIG. 4B, a first charge pump 122 adjusts the amount of charges to be supplied in response to a first comparison signal from a first phase comparison unit 112. A loop filter unit 130 sums the amount of charges to be supplied of the first charge pump 122 and the amount of charges to be supplied of a second charge pump 121 for accumulation. The voltage controlled oscillator 140 adjusts the output clock signal according to an output value (adjustment signal) of the loop filter unit 130, so the output clock signal is synchronized with the data clock signal. The voltage controlled oscillator 140 may be implemented with, but not limited to, a voltage control type oscillator or a current control type oscillator. The output clock signal output from the voltage controlled oscillator 140 may be generated to be fit to a data rate of a data receiver stage. In exemplary embodiments, the data clock signal may be sampled using a 180° phase of the output clock signal as a sampling signal. Sampling of the data clock signal may be performed, for example, by a second phase comparison unit 111.

FIG. 5A is a timing diagram for describing a function of a modulation clock generation unit of a clock and data recovery device according to an exemplary embodiment of the inventive concept. Referring to FIGS. 4A and 5A, a modulation clock generation unit 150 contains a frequency divider 151, a bit generator 152, and a modulation clock output unit 153. The frequency divider 151 divides a frequency of an output clock signal $f_{clock}$ by 1/M (M being an integer of 2 or more) to generate a frequency division clock signal $f_{clock}/M$. The frequency division clock signal $f_{clock}/M$ may have a period corresponding to M times the period of the output clock signal $f_{clock}$.

Figure 5B:
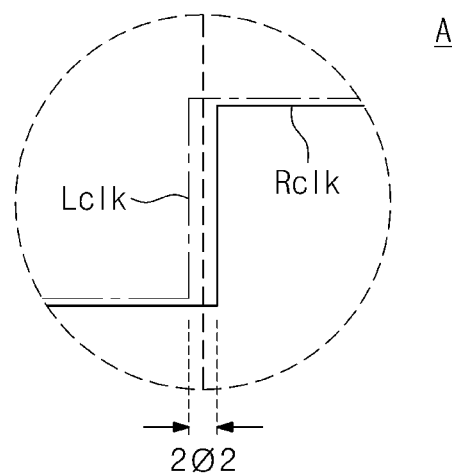
FIG. 5B is an expanded diagram of a portion "A" of FIG. 5A.
Figure 5C:
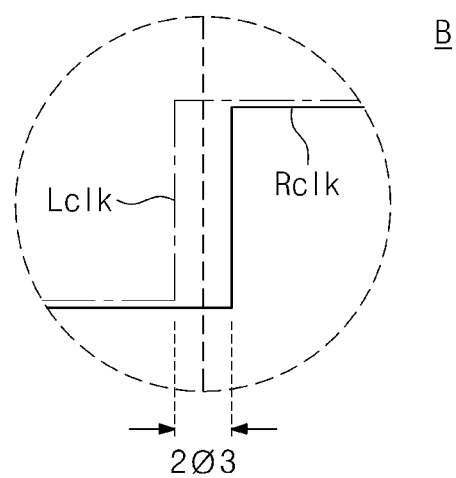
FIG. 5C is an expanded diagram of a portion "B" of FIG. 5A.

The bit generator 152 generates a bit signal in response to a clock edge of the frequency division clock signal $f_{clock}/M$, for example, a rising edge thereof. The modulation clock output unit 153 sequentially outputs modulated clock signals Lclk and Rclk according to the bit signal that the bit generator 152 generates. FIG. 5B is an expanded diagram of a portion "A" of FIG. 5A, and FIG. 5C is an expanded diagram of a portion "B" of FIG. 5A. Referring to FIGS. 4A and 5A to 5C, the modulation clock output unit 153 sequentially outputs the modulated clock signals Lclk and Rclk in synchronization with a rising edge of the bit signal from the bit generator 152. The modulated clock signals Lclk and Rclk may be sequentially input to a first phase comparison unit 112.

Figure 6:
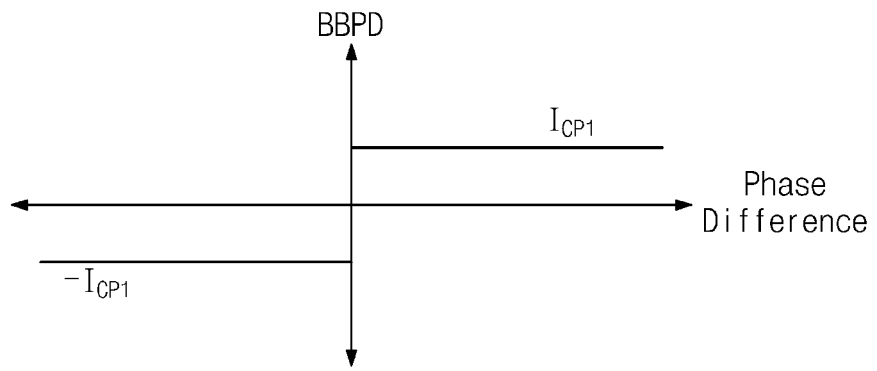
FIG. 6 is a diagram for describing a function of a second phase comparison unit of a clock and data recovery device according to an exemplary embodiment of the inventive concept.
Figure 7:
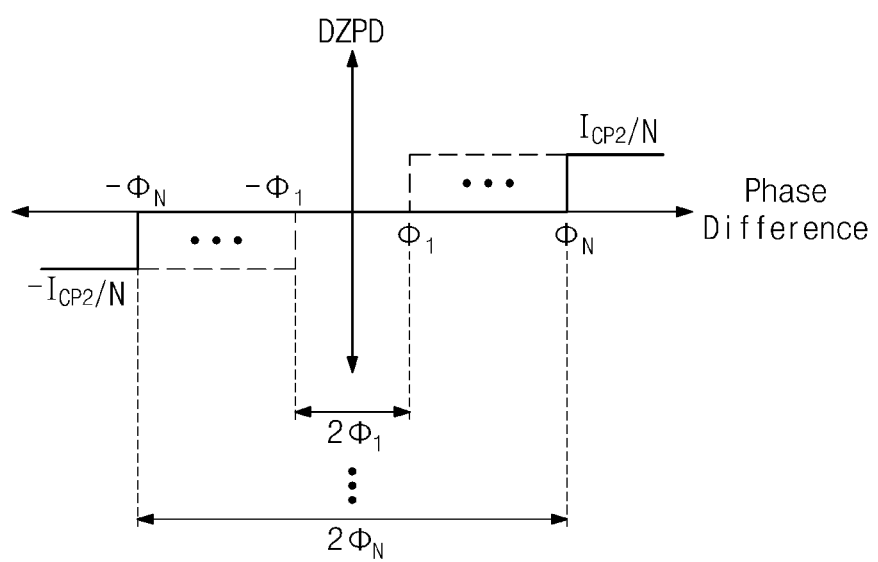
FIG. 7 is a diagram for describing a function of a first phase comparison unit of a clock and data recovery device according to an exemplary embodiment of the inventive concept.

FIG. 6 is a diagram for describing a function of a second phase comparison unit of a clock and data recovery device according to an exemplary embodiment of the inventive concept. FIG. 7 is a diagram for describing a function of a first phase comparison unit of a clock and data recovery device according to an exemplary embodiment of the inventive concept. FIGS. 8A to 8D are diagrams for describing a function of a phase detector according to an exemplary embodiment of the inventive concept. A second phase comparison unit 111, as illustrated in FIG. 6, outputs a second comparison signal as a result of only determining whether an output clock signal is leading or lagging a data clock signal. When a phase difference value between the data clock signal and the output clock signal is greater than a phase modulation value of a modulated clock signal, as illustrated in FIG. 7, a first phase comparison unit 112 outputs a first comparison signal for adjusting a phase of the output clock signal.

Figure 8A:
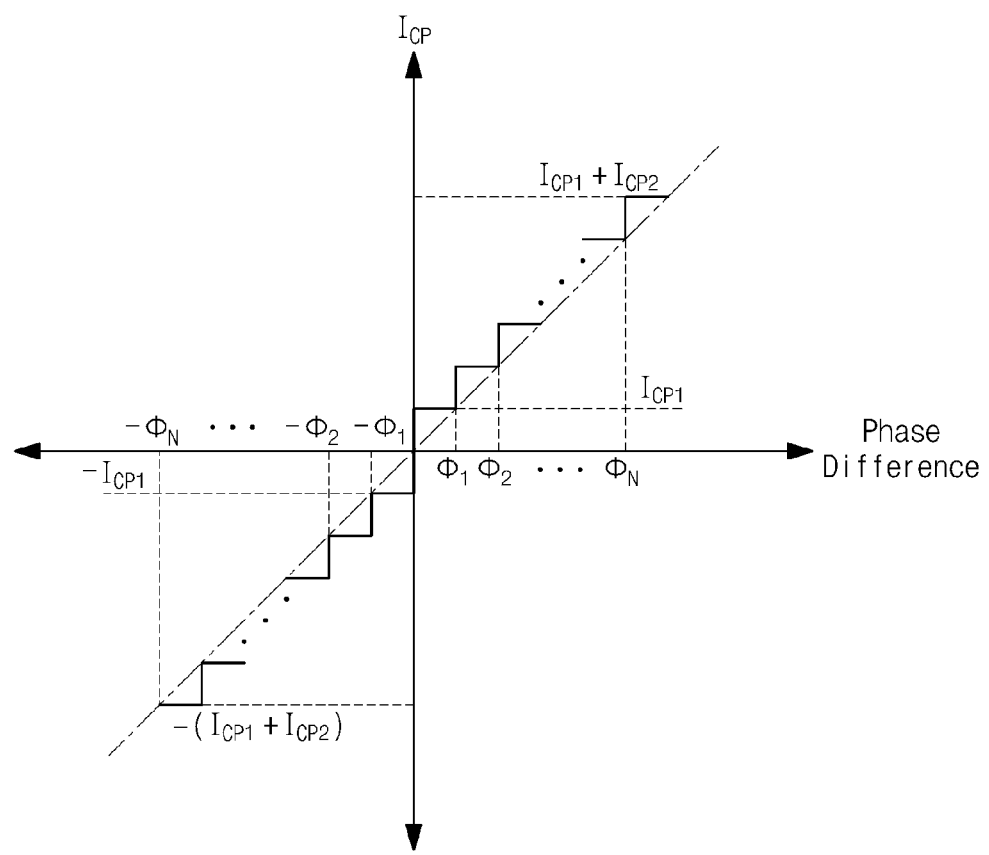
FIGS. 8A to 8D are diagrams for describing a function of a phase detector according to an exemplary embodiment of the inventive concept.

When a phase difference value between the data clock signal and the output clock signal is smaller than "$\Phi_1$", the first phase comparison unit 112 does not output the first comparison signal for adjusting a phase of the output clock signal with respect to all modulated clock signals. When a phase difference value between the data clock signal and the output clock signal is greater than "$\Phi_N$", the first phase comparison unit 112 outputs the first comparison signal for adjusting a phase of the output clock signal with respect to all modulated clock signals. Accordingly, the first phase comparison unit 112 outputs the first comparison signal for adjusting a phase of the output clock signal only if there is received a modulated clock signal having a phase modulation value smaller than a phase difference value between the data clock signal and the output clock signal. As illustrated in FIG. 8A, a phase of the data clock signal may be determined in a multi-level according to the first comparison signal accumulated with respect to all modulated clock signals.

A modulation clock generation unit 150 provides each of the modulated clock signals to a phase detector 110 during a predetermined time period. To improve a performance index of a clock and data recovery device, the time period where each modulated clock signal is provided to the phase detector 110 may be previously determined to have an optimum value according to the repetition rate of the modulated clock signal, the number of modulated clock signals, or a jitter characteristic of restored data.

Figure 8B:
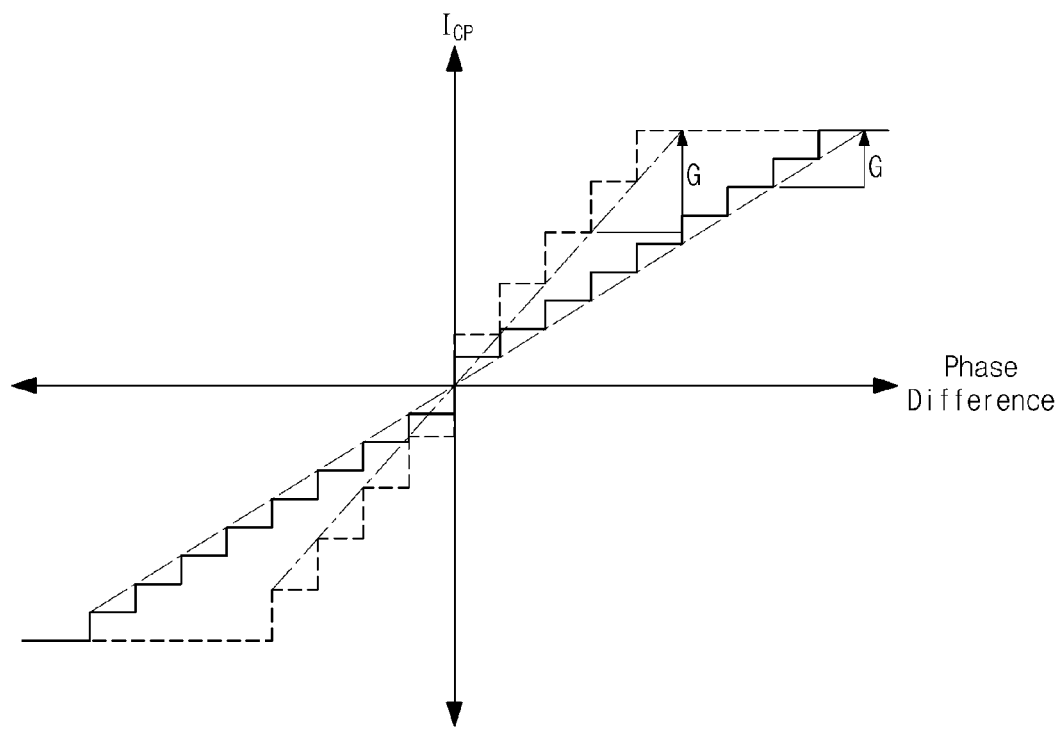

Referring to FIG. 8B, in the event that an input data clock signal includes great noise, a phase modulation level of modulated clock signals, the level number of modulated clock signals and a time period where modulated clock signals are provided to the phase detector 110 may be set such that gain G, that is, a change ratio of an output current value (the amount of charges) of a charge pump unit 120 to a phase modulation step is decreased. In other exemplary embodiments, when the input data clock signal includes relatively small noise, the gain G may be decreased. In still other exemplary embodiments, the gain G may be decreased if the number of modulated clock signals, that is, the number of levels is set to a relatively great value and may be increased if the number of levels is set to a relatively small value. With the above description, it is possible to improve a jitter characteristic of restored data and a band-width characteristic of a clock and data recovery device.

Figure 8C:
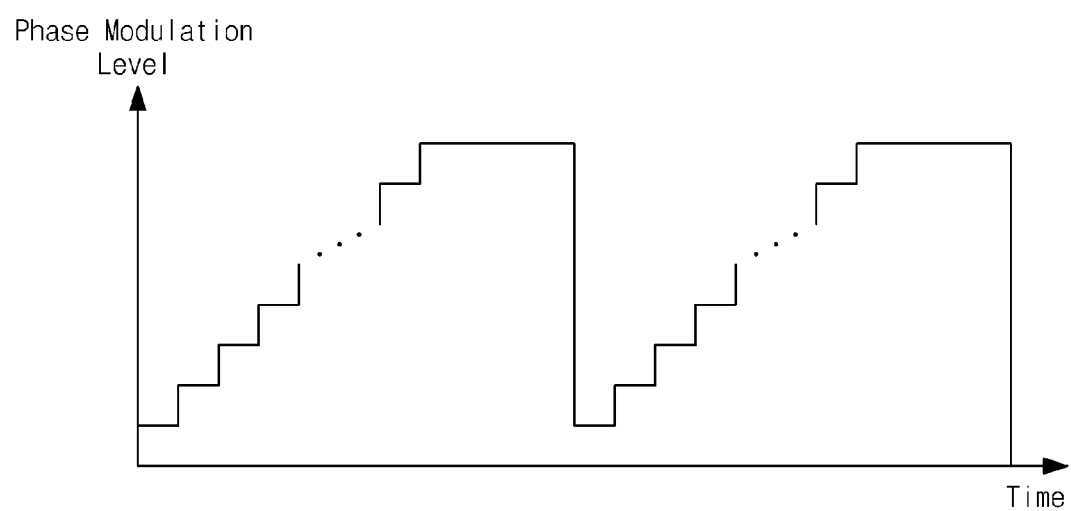
Figure 8D:
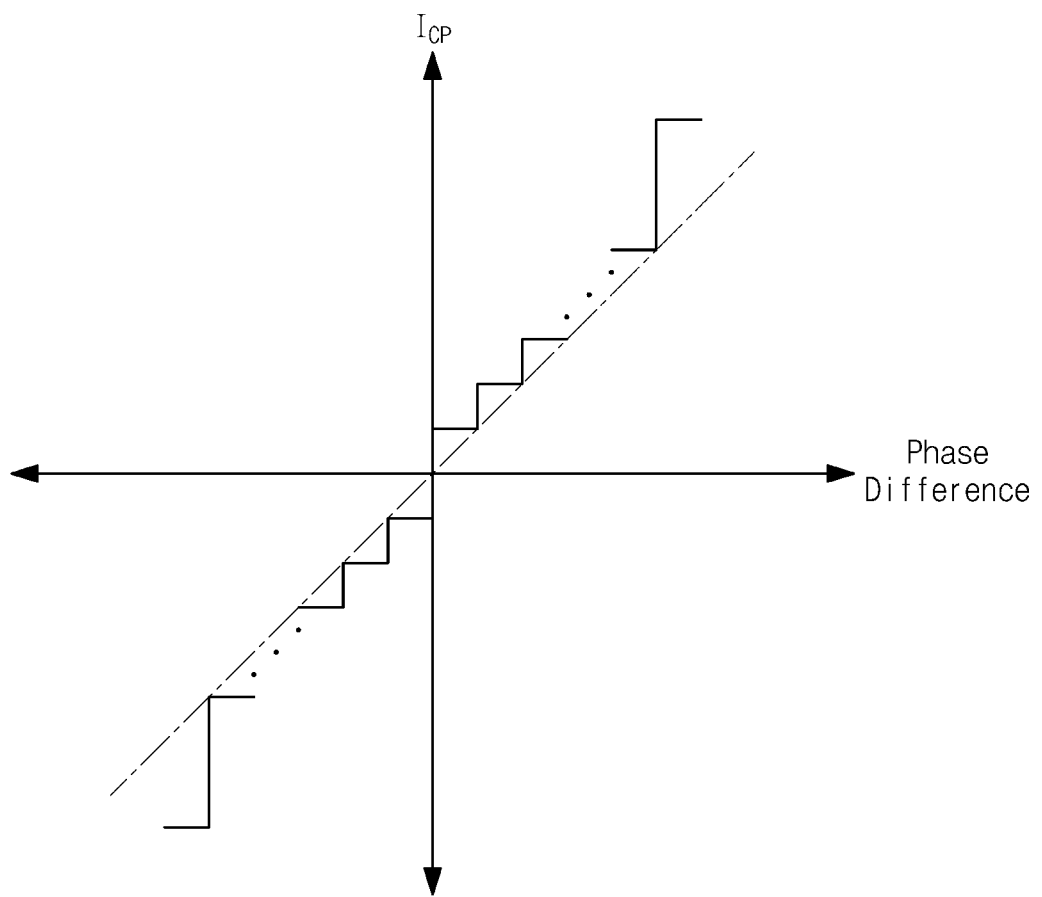

Referring to FIGS. 8C and 8D, a gain is changed differently according to an interval of modulated clock signals by increasing a time when a modulated clock signal experiencing relatively great phase modulation is provided to a phase detector. Accordingly, a performance index of the clock and data recovery device is improved.

Figure 9:
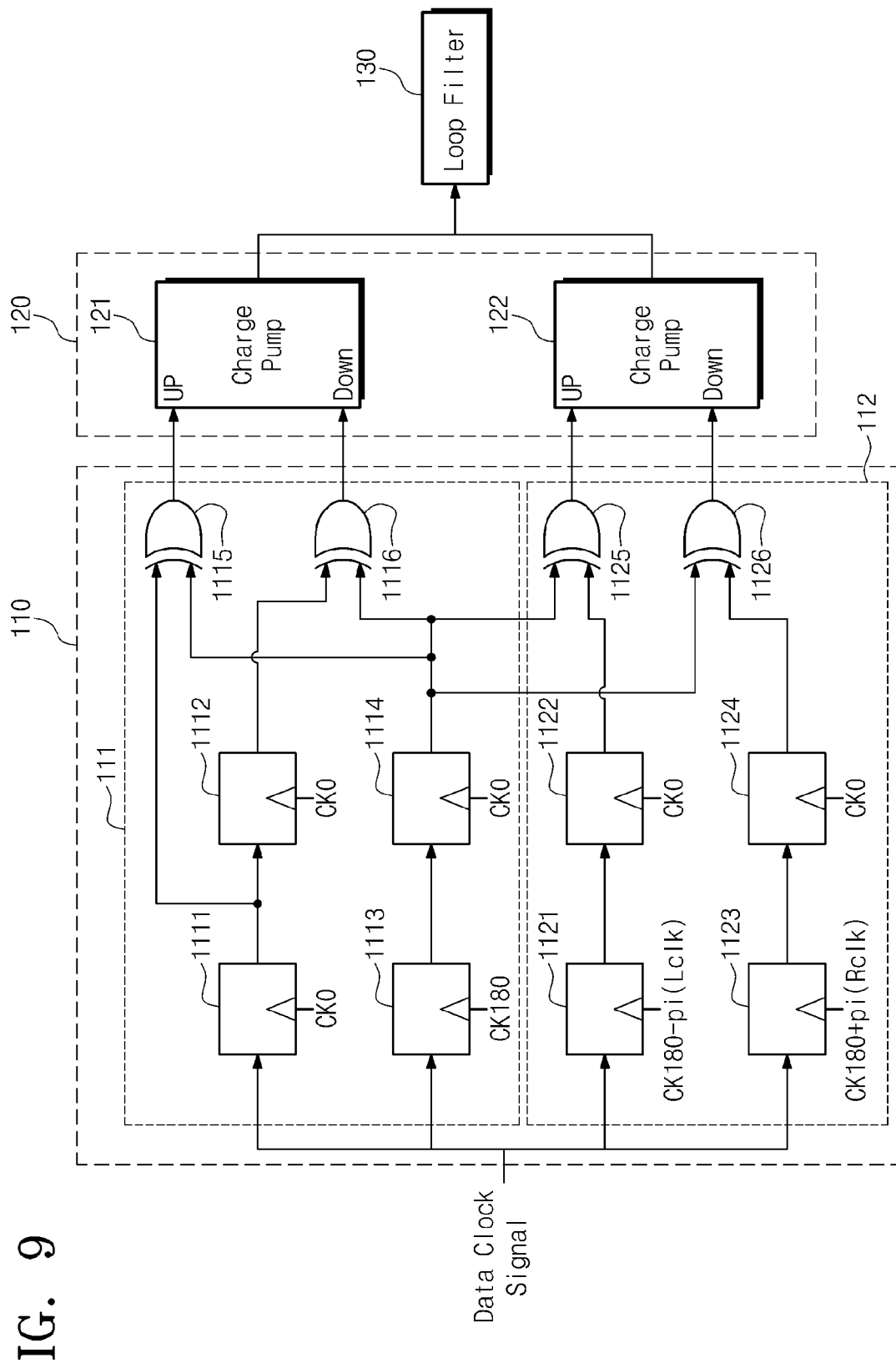
FIG. 9 is a detailed block diagram illustrating a phase detector of a clock and data recovery device according to an exemplary embodiment of the inventive concept.

FIG. 9 is a detailed block diagram illustrating a phase detector of a clock and data recovery device according to an exemplary embodiment of the inventive concept. Referring to FIG. 9, a second phase comparison unit 111 contains a first flip-flop 1111, a second flip-flop 1112, a third flip-flop 1113, a fourth flip-flop 1114, a first XOR gate 1115, and a second XOR gate 1116. The first flip-flop 1111 outputs a data clock signal in response to a first clock edge (e.g., a rising edge) CK0 of an output clock signal of a voltage controlled oscillator 140. The second flip-flop 1112 outputs an output value of the first flip-flop 1111 in response to a first clock edge CK0. The third flip-flop 1113 outputs the data clock signal in response to a second clock edge (e.g., a falling edge) CK180 of the output clock signal. The fourth flip-flop 1114 outputs an output value of the third flip-flop 1113 in response to the first clock edge CK0.

The first XOR gate 1115 compares the output value of the first flip-flop 1111 and the output value of the fourth flip-flop 1114. The second XOR gate 1116 compares the output value of the second flip-flop 1112 and the output value of the fourth flip-flop 1114. A second comparison signal from the second phase comparison unit 111, that is, an output value of the first XOR gate 1115 and an output value of the second XOR gate 1116 are provided to a second charge pump 121.

A first phase comparison unit 112 contains a fifth flip-flop 1121, a sixth flip-flop 1122, a seventh flip-flop 1123, an eighth flip-flop 1124, a third XOR gate 1125, and a fourth XOR gate 1126. The fifth flip-flop 1121 outputs a data clock signal in response to a first modulated clock signal CK180−pi (Lclk) sequentially input by a given time interval. The sixth flip-flop 1122 outputs an output value of the fifth flip-flop 1121 in response to the first clock edge CK0 of the output clock signal. The seventh flip-flop 1123 outputs the data clock signal in response to a second modulated clock signal CK180+pi (Rclk) sequentially input by a given time interval. The eighth flip-flop 1124 outputs an output value of the seventh flip-flop 1123 in response to the first clock edge CK0 of the output clock signal.

The third XOR gate 1125 compares an output value of the fourth or fifth flip-flop 1114 or 1121 and an output value of the sixth flip-flop 1122. The fourth XOR gate 1126 compares an output value of the second or fourth fifth flip-flop 1122 or 1114 and an output value of the eighth flip-flop 1124. A first comparison signal from the first phase comparison unit 112, that is, an output value of the third XOR gate 1125 and an output value of the fourth XOR gate 1126 are provided to a first charge pump 122.

Figure 10:
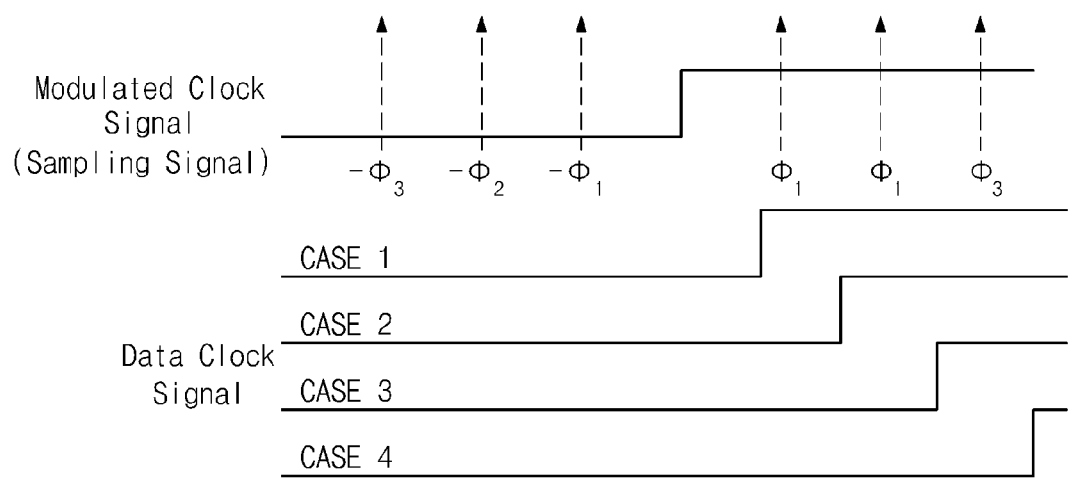
FIGS. 10 and 11 are diagrams for describing an operation of a clock and data recovery device according to an exemplary embodiment of the inventive concept.
Figure 11:
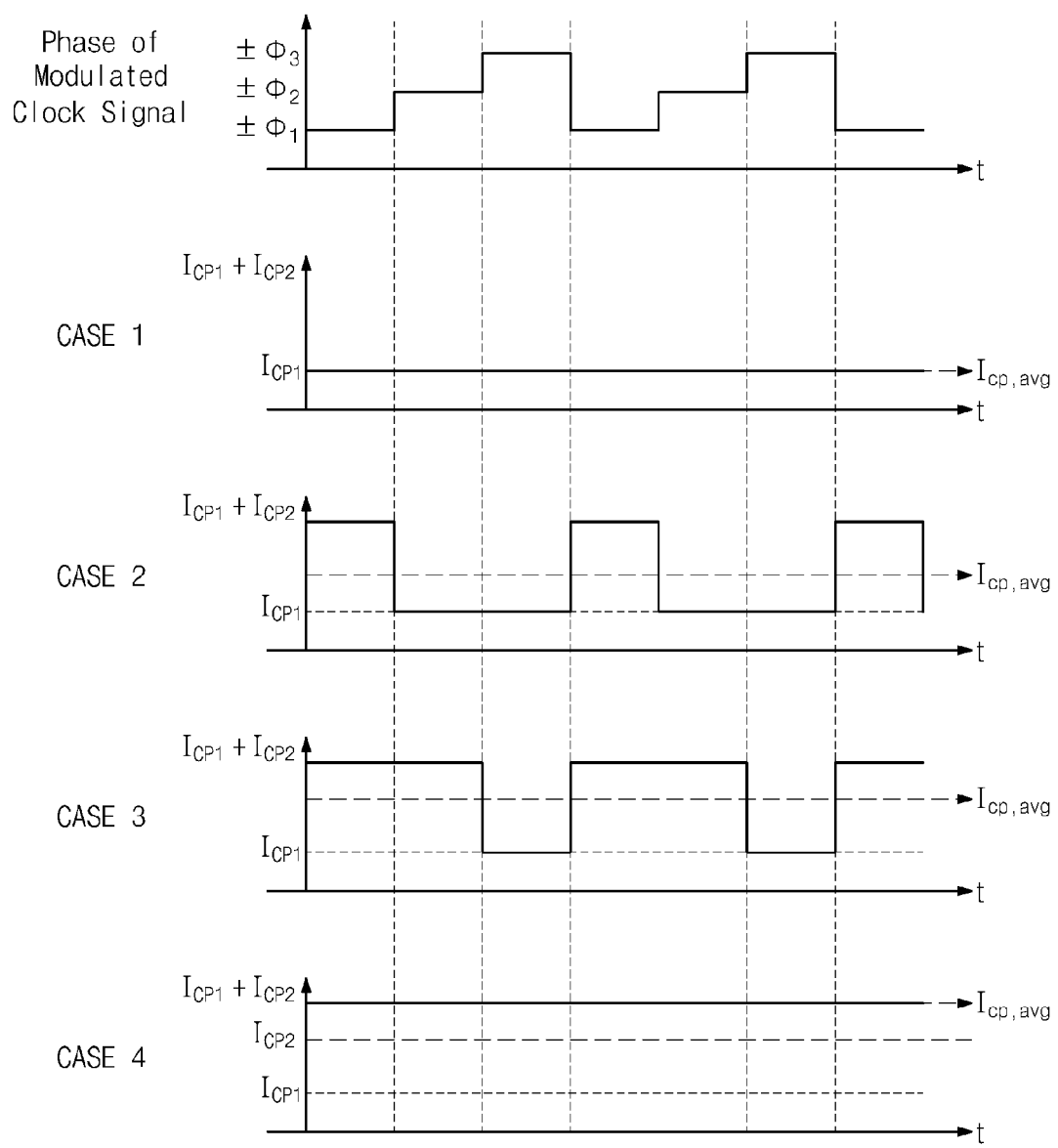

FIGS. 10 and 11 are diagrams for describing an operation of a clock and data recovery device according to an exemplary embodiment of the inventive concept. Referring to FIGS. 10 and 11, there are generated three pairs of modulated clock signals modulated according to three different phase modulation levels $\Phi_1$, $\Phi_2$, and $\Phi_3$. The modulated clock signals are sequentially input to a phase detector. Current values of a charge pump unit 120 about data clock signals corresponding to four cases shown in FIG. 10 are illustrated in FIG. 11. In FIG. 11, "$I_{CP1}$" denotes a current value of a second charge pump 121 according to an output of a second phase comparison unit 111, and "$I_{CP2}$" denotes a current value of a first charge pump 122 according to an output of a first phase comparison unit 112.

For case 1, a phase difference between an output clock signal of a voltage controlled oscillator 140 and a data clock signal belongs to dead-zones between all modulated clock signal pairs, so the current $I_{CP2}$ does not flow to the first charge pump 122 with respect to all modulated clock signals. Here, the dead-zone may mean a phase zone between paired modulated clock signals. Since a phase difference between the output clock signal and the data clock signal increases toward case 4 from case 2, a time when the current $I_{CP2}$ flows to the first charge pump 122 increases stepwise. For case 4, a phase difference between the output clock signal and the data clock signal gets out of dead-zones between all modulated clock signal pairs. In this case, the current $I_{CP2}$ flows to the first charge pump 122 regardless of a received modulated clock signal. According to an exemplary embodiment of the inventive concept, it is possible to minimize hardware components to be added and to implement a multi-level phase detector. In addition, it is possible to make a clock and data recovery device formed in a small area and having a low-power characteristic. The phase detector and the clock and data recovery device according to an exemplary embodiment of the inventive concept are applicable to a phase locked loop circuit.

Figure 12A:
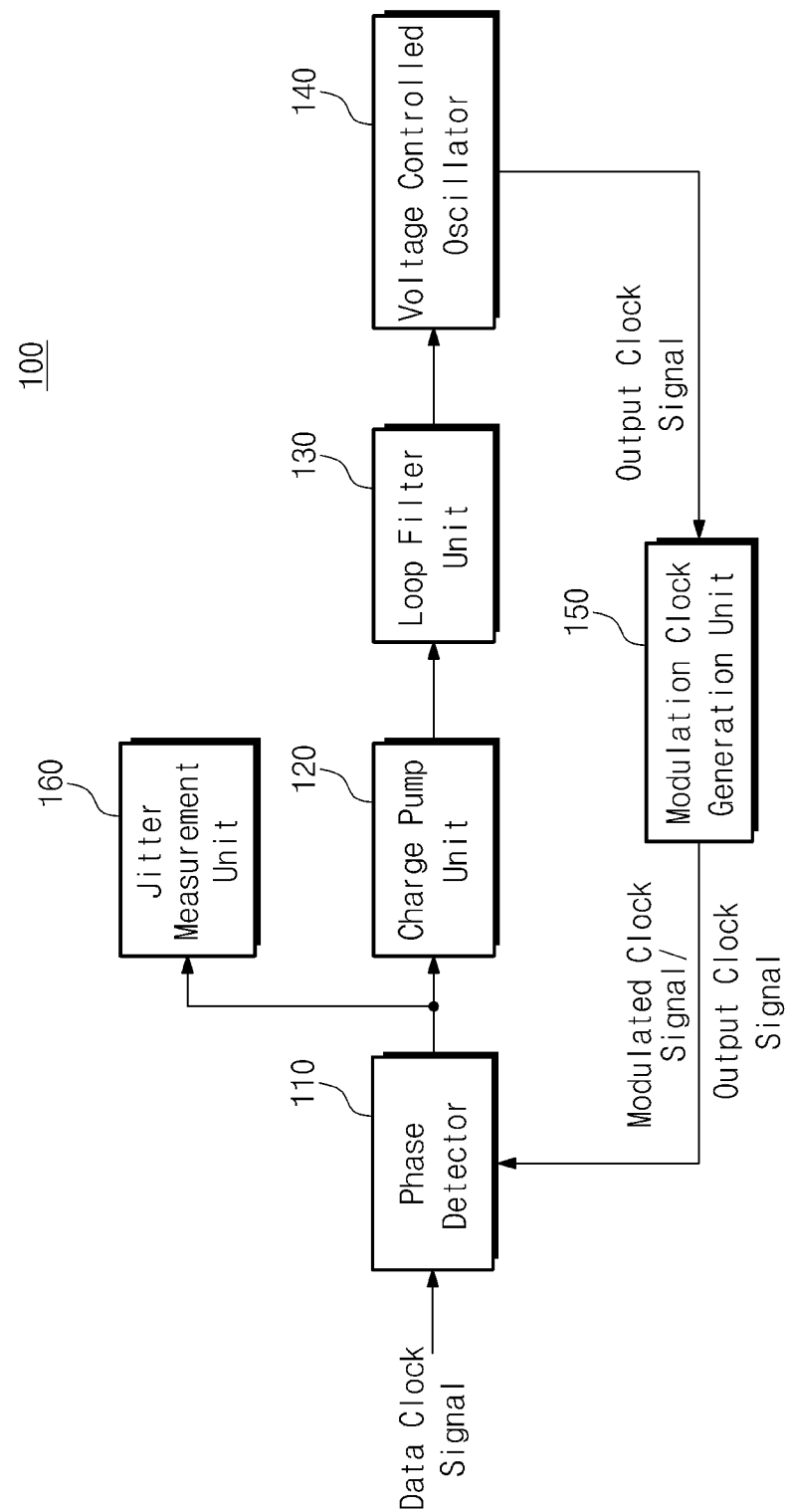
FIG. 12A is a block diagram schematically illustrating a clock and data recovery device according to another exemplary embodiment of the inventive concept.

FIG. 12A is a block diagram schematically illustrating a clock and data recovery device according to another exemplary embodiment of the inventive concept. In describing an embodiment of FIG. 12A, a description about components that are identical or equal to those of the above-described embodiment is omitted. Referring to FIG. 12A, a clock and data recovery device 100 contains a phase detector 110, a charge pump unit 120, a loop filter unit 130, a voltage controlled oscillator 140, a modulation clock generation unit 150, and a jitter measurement unit 160.

The jitter measurement unit 160 measures jitter of the clock and data recovery device 100 by comparing cumulative values of comparison signal from the phase detector 110 for different modulated clock signals. The jitter measurement unit 160 may measure the jitter by analyzing each cumulative value, corresponding to each of the modulated clock signals, through a histogram method.

Figure 12B:
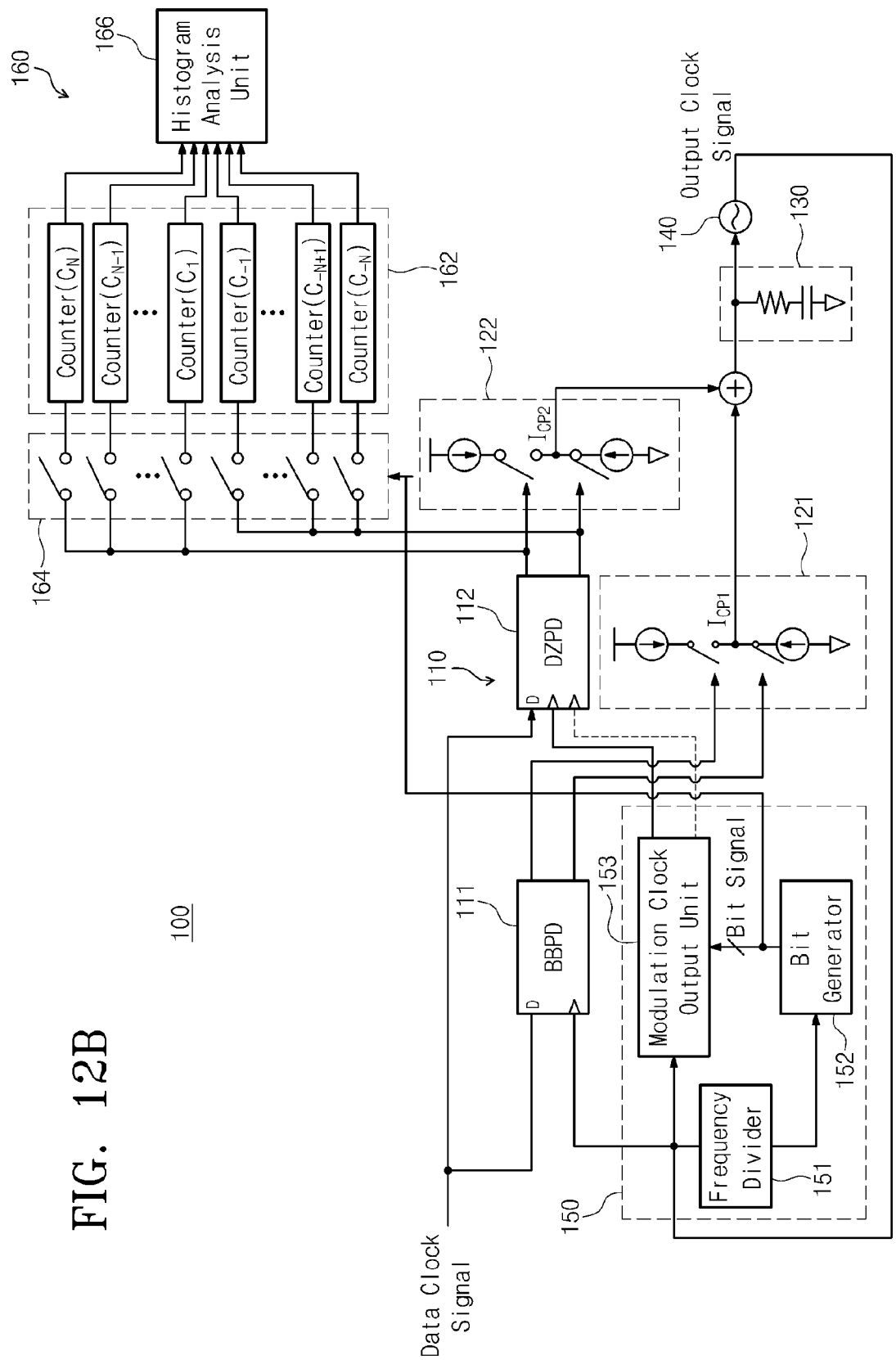
FIG. 12B is a detailed block diagram illustrating a clock and data recovery device of FIG. 12A.

FIG. 12B is a detailed block diagram illustrating a clock and data recovery device of FIG. 12A. Referring to FIGS. 12A and 12B, a jitter measurement unit 160 contains a plurality of counters 162, a selection circuit 164, and a histogram analysis unit 166. Each of the counters 162 may be provided for each modulated clock signal. The counters 162 individually measure cumulative values of comparison signal that correspond to modulated clock signals sequentially input to a first phase comparison unit 112. The selection circuit 164 is connected between a first phase comparison unit 112 and the counters 162 and selects one or more of the counters 162 in accordance with the modulated clock signal input to the first phase comparison unit 112. The histogram analysis unit 166 measures jitter through a histogram analysis about cumulative values respectively measured by the counters 162.

In an embodiment of FIG. 12B, there are provided 2N counters $C_{-N}$, $C_{-N+1}$ ... $C_N$ corresponding to N pairs of modulated clock signals. In exemplary embodiments, the selection circuit 164 may select a counter by turning on a switch (e.g., a transistor) in the following order according to a bit signal of a bit generator 152: $(C_1, C_{-1}) \to (C_2, C_{-2})$ ... $(C_{N-1}, C_{-N+1}) \to (C_N, C_{-N})$. The selected counter counts the event that a phase of a data clock signal gets out of a phase zone (dead-zone) between paired modulated clock signals. That is, the selected counter (or accumulator) may count and accumulate the event that a transition of the data clock signal gets out of a dead-zone.

In exemplary embodiments, N counters $C_1$ to $C_N$ may count the event that the data clock signal is changed at the right of a modulated clock signal, that is, the event that a phase of the data clock signal is lagging a modulated clock signal. Remaining counters $C_{-1}$ to $C_{-N}$ may count the event that the data clock signal is changed at the left of a modulated clock signal, that is, the event that a phase of the data clock signal is leading a modulated clock signal.

Figure 13A:
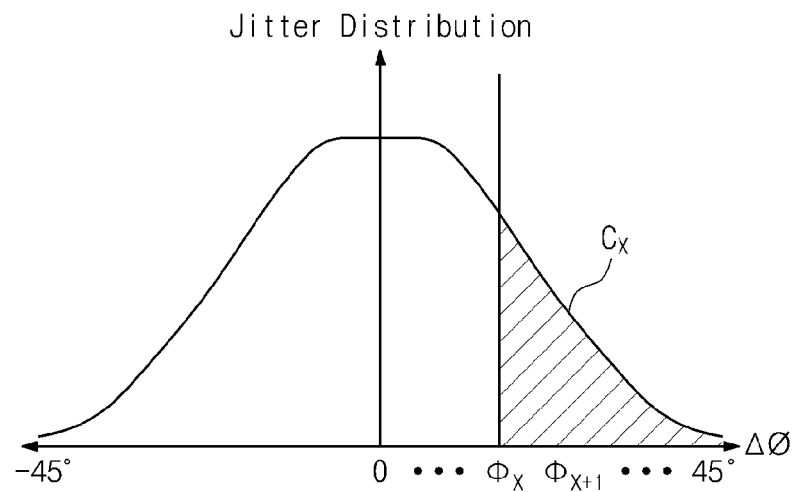
FIGS. 13A to 13C and FIG. 14 are diagrams for describing a jitter measurement method of a clock and data recovery device of FIG. 12B.
Figure 13B:
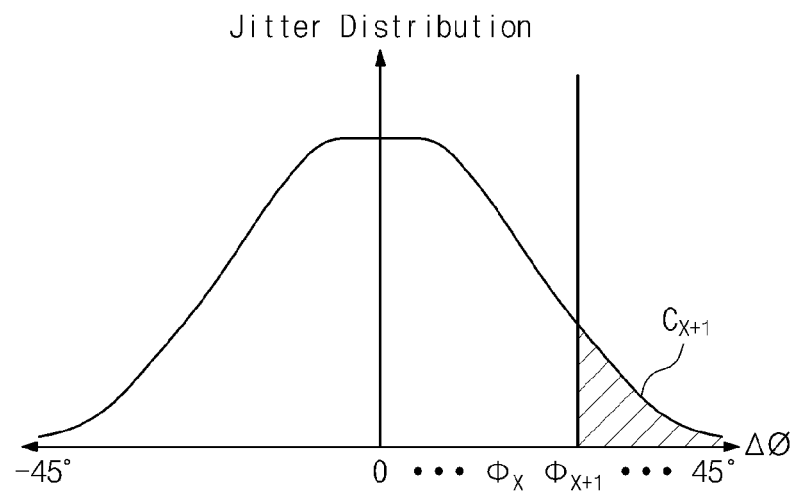

FIGS. 13A to 13C and 14 are diagrams for describing a jitter measurement method of a clock and data recovery device of FIG. 12B. Referring to FIG. 13A, when an x-th modulated clock signal is input to a first phase comparison unit 112, a selected counter with respect to the x-th modulated clock signal counts a comparison signal from the first phase comparison unit 112 and provides a histogram analysis unit 166 with a cumulative value $C_x$ of the count result. When an $x+1^{st}$ modulated clock signal is input to the first phase comparison unit 112, a selected counter with respect to the $x+1^{st}$ modulated clock signal counts a comparison signal from the first phase comparison unit 112 and provides the histogram analysis unit 166 with a cumulative value $C_{x+1}$ of the count result.

Figure 13C:
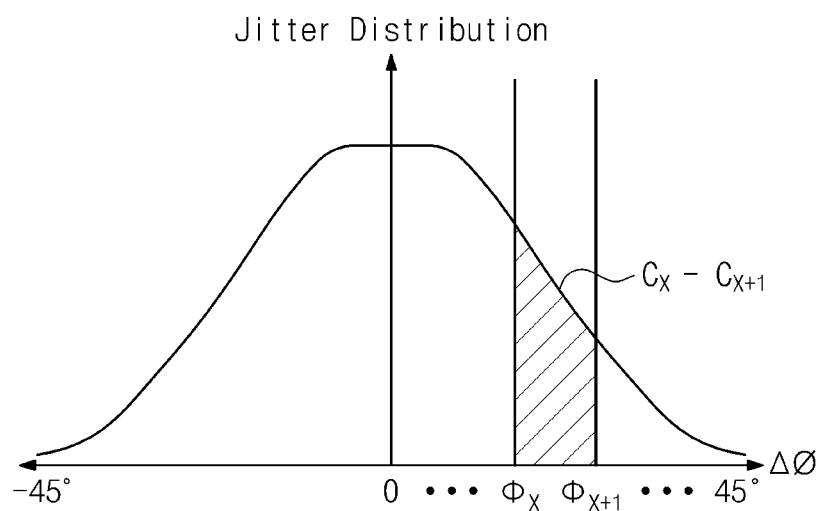
Figure 13C:
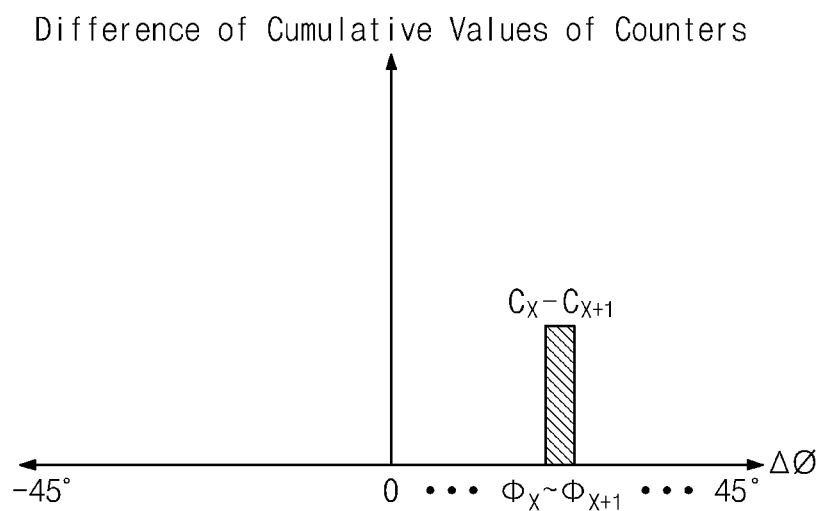
Figure 14:
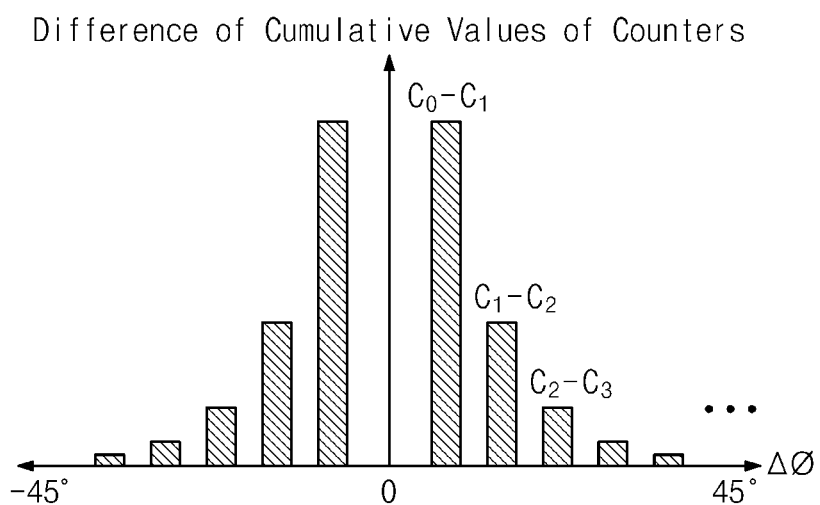

Referring to FIG. 13C, the histogram analysis unit 166 subtracts the cumulative value $C_{x+1}$ of the $x+1^{st}$ counter from the cumulative value $C_x$ of the x-th counter. A subtracted value $(C_x - C_{x+1})$ indicates the number of events that a data clock signal transitions between phases $\Phi_x$ and $\Phi_{x+1}$. A histogram diagram shown in FIG. 14 is obtained through subtracting results of cumulative values between counters 162 with respect to all dead-zones. In FIG. 13, a "$C_0$" value is set to a value with respect to the number of data edges that exists between $\Phi_0$ and $\Phi_1$ under a condition where a data transition occurs between $\Phi_{-1}$ and $\Phi_1$.

It is understood that jitter is smaller as a jitter histogram is focused toward a center. That the jitter histogram is distributed means that the jitter is greater. As the jitter of a clock and data recovery device becomes smaller, there is reduced the number of events that a data clock signal transitions at a phase zone between adjacent modulated clock signals, with a phase of an output clock signal synchronized with the clock and data recovery device. In this case, values $C_{\pm 1}$, $C_{\pm 2}$ ... $C_{\pm N}$ measured by counters are reduced, thereby making a jitter histogram distribution focused toward a center.

In contrast, as the jitter of the clock and data recovery device becomes greater, there is increased the number of events that a data clock signal transitions at a phase zone between adjacent modulated clock signals, with a phase of an output clock signal synchronized with the clock and data recovery device. In this case, a level of jitter measured by a counter may permit values $C_{\pm 1}$, $C_{\pm 2}$ ... $C_{\pm N}$ to increase, values $(C_0 - C_1)$ and $(C_0 - C_{-1})$ to relatively decrease, and values $(C_1 - C_2)$ and $(C_2 - C_3)$ to relatively increase. This means that the jitter histogram distribution becomes wide.

Thus, it is possible to monitor the jitter of the clock and data recovery device from the jitter histogram distribution. According to an exemplary embodiment of the inventive concept, how many a signal transition occurs between dead-zones is determined through simple calculation. This is converted into the form of quantity and shape of a jitter distribution by analyzing the jitter histogram, thereby making it possible to monitor the jitter of the clock and data recovery device.

A clock and data recovery device according to an exemplary embodiment of the inventive concept outputs a comparison signal as a result of comparing phases between a data clock signal and each modulated clock signal modulated to have different phases using an output clock signal. The clock and data recovery device measures jitter by comparing cumulative values of comparison signals corresponding to the modulated clock signals. Accordingly, it is possible to measure the jitter of the clock and data recovery device simply and efficiently by maximally using circuits that the clock and data recovery device itself includes.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A clock and data recovery device comprising:
   a phase detector configured to detect a phase of a data clock signal to output a comparison signal;
   a charge pump unit configured to adjust the amount of charges to be supplied according to the comparison signal;
   a loop filter unit configured to accumulate the amount of charges to be supplied to output an adjustment signal;
   a voltage controlled oscillator configured to generate an output clock signal variable according to the adjustment signal;
   a modulation clock generation unit configured to modulate a phase of the output clock signal to generate modulated clock signals having different phases and provide the modulated clock signals sequentially to the phase detector,
   wherein the phase detector compares phases of the data clock signal and each of modulated clock signals sequentially received to output the comparison signal.

2. The clock and data recovery device of claim 1, wherein the modulation clock generation unit comprises:
   a frequency divider configured to divide a frequency of the output clock signal to generate a frequency division clock signal;
   a bit generator configured to generate a bit signal in response to a clock edge of the frequency division clock signal; and
   a modulation clock output unit configured to sequentially output the modulated clock signals according to the bit signal.

3. The clock and data recovery device of claim 1, wherein the modulation clock generation unit generates the modulated clock signals having a linear phase difference from the output clock signal.

4. The clock and data recovery device of claim 1, wherein the modulation clock generation unit provides the phase detector with each modulated clock signal during a predetermined time period,
   the predetermined time period of each modulated clock signal is set according to the repetition rate of the modulated clock signal, the number of modulated clock signals, or both.

5. The clock and data recovery device of claim 1, wherein the phase detector comprises:
   a first phase comparison unit configured to sequentially compare a phase of the data clock signal and a phase of each modulated clock signal to output a first comparison signal.

6. The clock and data recovery device of claim 5, wherein the phase detector further comprises:
   a second phase comparison unit configured to compare a phase of the data clock signal and a phase of the output clock signal to output a second comparison signal, and
   wherein the charge pump unit comprises:
   a first charge pump configured to adjust the amount of charges to be supplied according to the first comparison signal; and
   a second charge pump configured to adjust the amount of charges to be supplied according to the second comparison signal.

7. The clock and data recovery device of claim 6, wherein the second phase comparison unit comprises:
   a first flip-flop configured to output the data clock signal in response to a first clock edge of the output clock signal;
   a second flip-flop configured to output an output value of the first flip-flop in response to the first clock edge;
   a third flip-flop configured to output the data clock signal in response to a second clock edge of the output clock signal;
   a fourth flip-flop configured to output an output value of the third flip-flop in response to the first clock edge;
   a first XOR gate configured to compare the output value of the first flip-flop and an output value of the fourth flip-flop; and
   a second XOR gate configured to compare an output value of the second flip-flop and the output value of the fourth flip-flop.

8. The clock and data recovery device of claim 7, wherein the first phase comparison unit comprises:
   a fifth flip-flop configured to output the data clock signal in response to a first modulated clock signal sequentially input;
   a sixth flip-flop configured to output an output value of the fifth flip-flop in response to the first clock edge;
   a seventh flip-flop configured to output the data clock signal in response to a second modulated clock signal sequentially input;
   an eighth flip-flop configured to output an output value of the seventh flip-flop in response to the first clock edge;
   a third XOR gate configured to compare the output value of the first or fourth flip-flop and an output value of the sixth flip-flop; and
   a fourth XOR gate configured to compare the output value of the second or fourth flip-flop and an output value of the eighth flip-flop.

9. The clock and data recovery device of claim 8, wherein the first modulated clock signal is a signal having a phase leading the output clock signal, and
   wherein the second modulated clock signal is a signal having a phase lagging the output clock signal.

10. The clock and data recovery device of claim 8, wherein the first comparison signal comprises an output value of the first XOR gate and an output value of the second XOR gate, and
   wherein the second comparison signal comprises an output value of the third XOR gate and an output value of the fourth XOR gate.

11. The clock and data recovery device of claim 1, further comprising:

a jitter measurement unit configured to compare cumulative values of the comparison signal to measure a jitter, each cumulative value corresponding to each of the modulated clock signals.

12. The clock and data recovery device of claim 11, wherein the jitter measurement unit comprises a plurality of counters configured to measure cumulative values of the comparison signal, the each cumulative value being measured for each of the modulated clock signals.

13. The clock and data recovery device of claim 12, wherein the jitter measurement unit further comprises:
a selection circuit connected between the phase detector and the plurality of counters, the selection circuit being configured to select one of the plurality of counters in response to a modulated clock signal and connect the selected at least one counter to the phase detector.

14. The clock and data recovery device of claim 12, wherein the jitter measurement unit further comprises:
a histogram analysis unit configured to analyze cumulative values measured by the plurality of counters in a histogram method to measure a jitter.

15. A phase detector comprising:
a first phase comparison unit configured to sequentially receive modulated clock signals modulated from a first clock signal to have different phases, and to compare phases of a data clock signal and each of the modulated clock signals sequentially input to output a first comparison signal; and
a modulation clock generation unit configured to modulate a phase of the first clock signal to generate the modulated clock signals having different phases and provide the modulated clock signals sequentially to the first phase comparison unit.

16. The phase detector of claim 15, wherein the first phase comparison unit sequentially receives the modulated clock signals modulated to have a linear phase difference from the first clock signal.

17. The phase detector of claim 15, wherein the first phase comparison unit receives each of the modulated clock signals during the same time period and outputs the first comparison signal.

18. The phase detector of claim 15, further comprising:
a second phase comparison unit configured to compare phases of the data clock signal and the first clock signal to output a second comparison signal.

* * * * *